(12) United States Patent
Bancel et al.

(10) Patent No.: US 8,466,727 B2
(45) Date of Patent: Jun. 18, 2013

(54) PROTECTION AGAINST FAULT INJECTIONS OF AN ELECTRONIC CIRCUIT WITH FLIP-FLOPS

(75) Inventors: Frédéric Bancel, Senas (FR); Philippe Roquelaure, Bouc-Bel-Air (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 31 days.

(21) Appl. No.: 12/510,704

(22) Filed: Jul. 28, 2009

(65) Prior Publication Data
US 2010/0026358 A1 Feb. 4, 2010

(30) Foreign Application Priority Data
Jul. 30, 2008 (FR) ..................................... 08 55256

(51) Int. Cl.
*H03K 3/289* (2006.01)
(52) U.S. Cl.
USPC ................ 327/202; 327/3; 327/144; 327/211
(58) Field of Classification Search
USPC ............................................... 327/200–203
See application file for complete search history.

(56) References Cited

U.S. PATENT DOCUMENTS

| 5,381,418 | A | | 1/1995 | Montoye | |
|---|---|---|---|---|---|
| 5,703,513 | A | * | 12/1997 | Hashizume et al. | 327/202 |
| 5,799,048 | A | * | 8/1998 | Farjad-Rad et al. | 375/360 |
| 6,121,804 | A | * | 9/2000 | Bryan et al. | 327/144 |
| 6,630,853 | B1 | * | 10/2003 | Hamada | 327/202 |
| 6,909,314 | B2 | * | 6/2005 | Ahn | 327/202 |

OTHER PUBLICATIONS

French Search Report dated Mar. 31, 2009, from French Application No. 08/55256.

* cited by examiner

*Primary Examiner* — Ryan Jager
(74) *Attorney, Agent, or Firm* — Wolf, Greenfield & Sacks, P.C.

(57) ABSTRACT

A method for detecting a disturbance of the state of a synchronous flip-flop of master-slave type including two bistable circuits in series, in which the bistable circuits are triggered by two first signals different from each other, and the level of an intermediary junction point between the two bistable circuits is compared both to the level present at the input of the master-slave flip-flop and to the level present at the output, which results in two second signals providing an indication as to the presence of a possible disturbance.

26 Claims, 4 Drawing Sheets

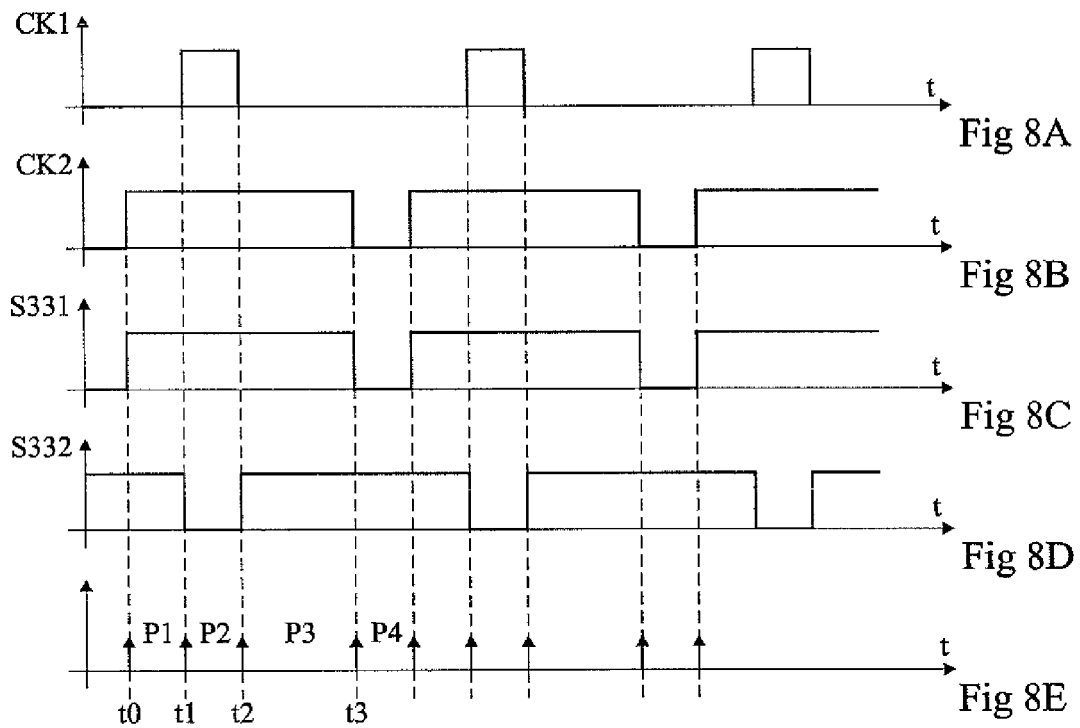
Fig 8A
Fig 8B
Fig 8C
Fig 8D
Fig 8E
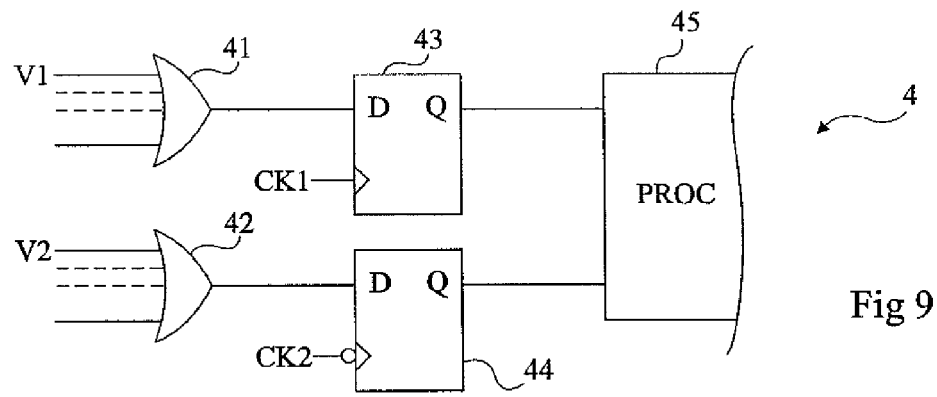
Fig 9
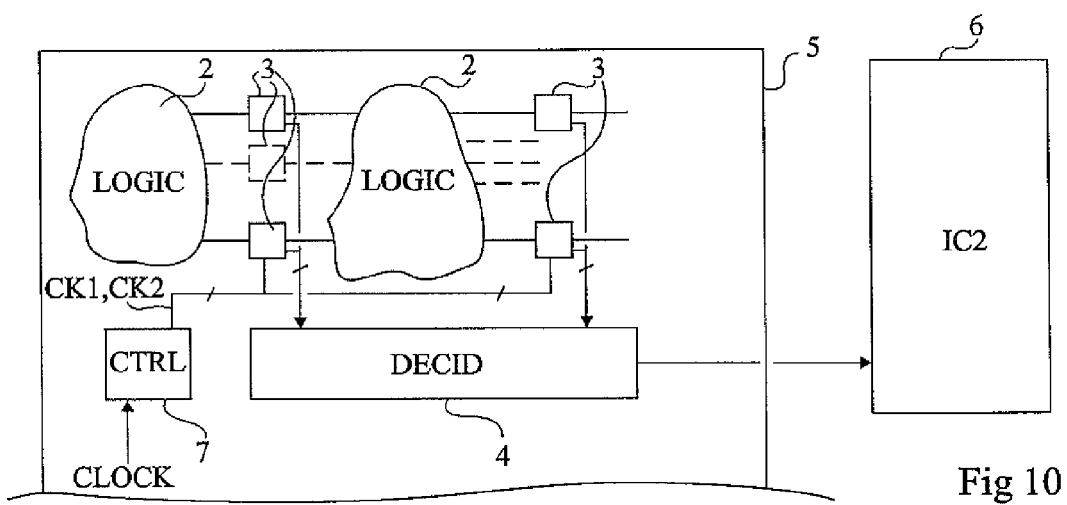
Fig 10

PROTECTION AGAINST FAULT INJECTIONS OF AN ELECTRONIC CIRCUIT WITH FLIP-FLOPS

CROSS REFERENCE TO RELATED APPLICATIONS

This application claims the priority benefit of French patent application number 08/55256, filed on Jul. 30, 2008, entitled "PROTECTION AGAINST FAULT INJECTIONS OF AN ELECTRONIC CIRCUIT WITH FLIP-FLOPS," which is hereby incorporated by reference to the maximum extent allowable by law.

BACKGROUND OF THE INVENTION

1. Field of the Invention

The present invention generally relates to electronic circuits and, more specifically, to circuits comprising synchronous flip-flops. The present invention more specifically applies to the detection of a possible disturbance in a logic data processing path comprising one or several synchronous flip-flops, be this disturbance incidental or intentional.

2. Discussion of the Related Art

In many electronic circuits, synchronization flip-flops are used between logic gate blocks to create elements for storing values (for example, registers, counters, etc.). It is then desirable for the binary states manipulated by the flip-flops to be reliable. Now, incidental or intentional disturbances occurring on the electronic circuit (for example, voltage peaks, laser pulses, etc.) may affect the data manipulated by the synchronization flip-flops. Static and dynamic effects can be distinguished. Static effects essentially result from intentional disturbances (for example, laser attacks) and directly modify the internal state of a flip-flop without intervening on the rate of the signals. Dynamic effects cause an error in the capture of the datum at the input of a flip-flop and may result from incidental or intentional disturbances. Such dynamic effects are linked to the intrinsic characteristics of synchronization flip-flops which require that a datum be present at the data input long enough before a storage-triggering edge (setup time) and remain present long enough after this triggering edge (hold time). If a triggering signal (typically, a clock signal) is accelerated, or the datum is delayed, the acquisition may not respect the setup time. Delaying the clock signal or accelerating the datum may result in not respecting the hold time.

Such disturbances are particularly critical in electronic circuits manipulating data which are desired to be protected against an unauthorized access (for example, keys or ciphering algorithms or data meant to remain secret).

SUMMARY OF THE INVENTION

It would be desirable to be able to detect that the data of one or several synchronization flip-flops have undergone incidental or intentional disturbances, be the disturbance of dynamic or static origin.

It would also be desirable to make this detection possible for all the flip-flops of a circuit or at least for those manipulating data considered as critical.

It would also be desirable to be able to select, within a same circuit or operating process, periods of activation and of deactivation of the protection.

To achieve all or part of these objects as well as others, an embodiment of the present invention provides a method for detecting a disturbance of the state of a synchronous flip-flop of master-slave type comprising two bistable circuits in series, in which:

the bistable circuits are triggered by two first signals different from each other; and the level of an intermediary junction point between the two bistable circuits is compared both to the level present at the input of the master-slave flip-flop and to the level present at the output, which results in two second signals providing an indication as to the presence of a possible disturbance.

According to an embodiment of the present invention, the second signals are sampled on edges of the first signals.

According to an embodiment of the present invention, the first signals are generated so that the bistable circuits are controlled cyclically in four successive periods, in which;

both circuits are latched;
only a first circuit is latched;
both circuits are latched; and
only a second circuit is latched.

According to an embodiment of the present invention, the periods when both circuits are latched provide, on the second signals, states indicative of a possible disturbance.

According to an embodiment of the present invention, a constant level of one of the first signals deactivates the detection.

An embodiment of the present invention provides a master-slave synchronous flip-flop comprising:

two bistable circuits in series;
two terminals of application of triggering signals; and
a first logic circuit for comparing the states at the flip-flop input, between is the two bistable circuits, and at the flip-flop output.

According to an embodiment of the present invention, a second logic circuit is interposed between the two terminals of application of the triggering signals and respective triggering terminals of the bistable circuits.

According to an embodiment of the present invention, the first logic circuit comprises two comparators respectively of the data input with the intermediary value, and of this intermediary value with the output.

According to an embodiment of the present invention, the second logic circuit comprises:

an OR-type gate having its respective inputs connected to the terminals of application of the triggering signals and having an output connected to the triggering terminal of the first bistable circuit; and an inverter between one of the terminals of application of the triggering signals and the triggering terminal of the second bistable circuit.

An embodiment of the present invention provides an electronic circuit comprising at least one logic combination block and at least one set of master-slave synchronous flip-flops.

According to an embodiment of the present invention, not all flip-flops are controlled at the same time in comparison mode.

The foregoing objects, features, and advantages of the present invention will be discussed in detail in the following non-limiting description of specific embodiments in connection with the accompanying drawings.

BRIEF DESCRIPTION OF THE DRAWINGS

FIGS. 8A, 8B, 8C, 8D, and 8E are timing diagrams illustrating the operation of the master-slave flip-flop of FIG. 7;

FIG. 9 shows an embodiment of a circuit for exploiting the detection performed by several master-slave flip-flops; and FIG. 10 illustrates an example of a system comprising an integrated circuit equipped with disturbance-detection flip-flops.

DETAILED DESCRIPTION

Figure 1:
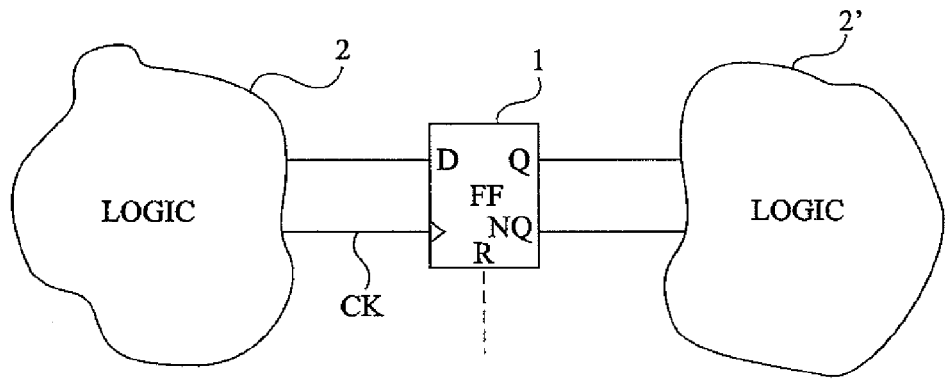
FIG. 1 is a simplified representation of a master-slave flip-flop in an example of environment.

The same elements have been designated with the same reference numerals in the different drawings, where the timing diagrams have been drawn out of scale.

For clarity, only those elements which are useful to the understanding of the present invention have been shown and will be described. In particular, the circuits upstream and downstream of the flip-flops to which the present invention applies have not been detailed, the present invention being compatible with any usual logic circuit. Further, the circuits exploiting the performed detections have not been detailed either, the present invention being here again compatible with any usual countermeasure in the case where a disturbance has been detected (for example, stopping of the circuit, blocking of the output ports, resetting, alert, etc.).

FIG. 1 schematically shows a synchronous storage flip-flop 1 of master-slave type (D flip-flop) in an example of environment. Typically, flip-flop 1 is associated, upstream, with logic elements 2 (LOGIC) and, downstream, with other logic processing elements 2'. Flip-flop 1 comprises a data input D and direct and inverted outputs Q and NQ, as well as a terminal of application of a triggering or clock signal. Sometimes, a reset input R enables to reset the flip-flop state, for example, as the circuit is powered on. Storage flip-flop 1 may, according to its configuration, be triggered on a rising edge or on a falling edge of signal CK. In a rising edge version, the Q output copies the D input at each rising edge of signal CK.

Figure 2:
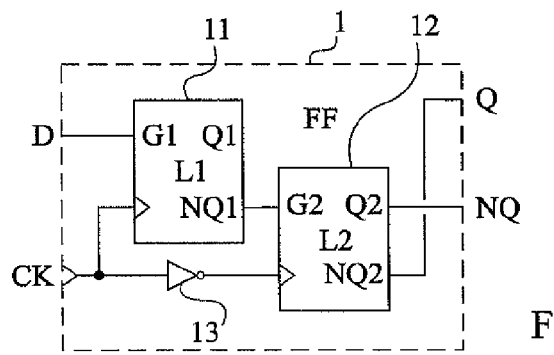
FIG. 2 is a block diagram of a master-slave flip-flop.

FIG. 2 illustrates, in the form of blocks, the structure of a usual master-slave D flip-flop 1. Such a flip-flop associates two latch-type bistable circuits 11 and 12. Each circuit 11, 12 comprises a data input G1, G2, a triggering terminal and direct and inverted outputs Q1, Q2, and NQ1, NQ2. Bistable circuit 11 forms the master circuit and bistable circuit 12 forms the slave circuit of master-slave flip-flop 1.

The D data input of flip-flop 1 is connected to data input G1 of first bistable circuit 11. Inverse input NQ1 of circuit 11 is connected to data input G2 of circuit 12. Output Q2 of circuit 12 defines the inverted output NQ of flip-flop 1 while inverse input NQ2 of circuit 12 defines the direct output Q thereof. The triggering terminals of circuits 11 and 12 receive, in a conventional master-slave flip-flop, a common clock signal. This triggering signal is directly addressed to first bistable circuit 11 and is inverted (inverter 13) to be sent onto second bistable circuit 12. In other flip-flops, input G2 is connected to output Q1 and the Q output is sampled from output Q2.

Figure 3:
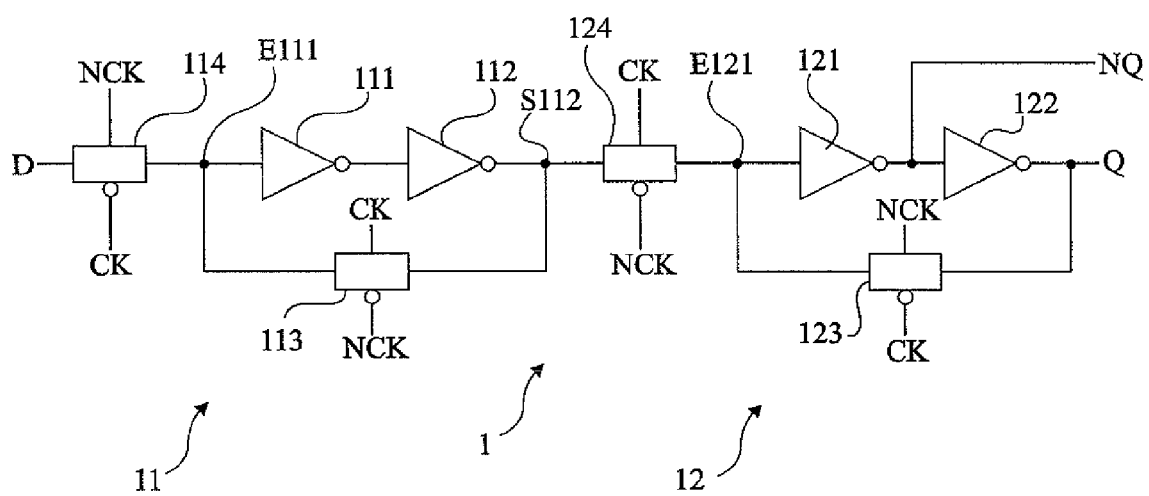
FIG. 3 is a more detailed electric diagram of an embodiment of a master-slave flip-flop.

FIG. 3 shows a master-slave device 1 of the type shown in FIG. 2, where an example of the structure of bistable circuits 11 and 12 is detailed. Each circuit 11 and 12 is formed of two inverters 111 and 112, respectively 121 and 122 in series. The output of each second inverter 112, 122 is looped back onto the input of the first one 111, 121 via a switch 113, 123. The respective inputs of first inverters 111 and 121 are connected to a switch 114, 124. Switches 113, 114, 123, and 124 are all controlled by a same clock signal CK and are three-state switches (on-state, off-state, and high-impedance state). Switches 113 and 124 are on when signal CK is at state 1 and are off when it is at state 0 (inverse signal NCK in the high state) while switches 114 and 123 are conversely on when signal CK is low. The D input of the master-slave flip-flop corresponds to the input of switch 114 and its Q and NQ outputs respectively correspond to the outputs of inverters 122 and 121.

FIGS. 4A, 4B, 4C, 4D, 4E, 4F, 4G, 4H, 4I, and 4J illustrate, in timing diagrams, the operation of a master-slave flip-flop of the type shown in FIG. 3. These drawings respectively show examples of shapes of signals applied on terminals NCK, CK, and D, of states of switches 114 and 123, of states of switches 113 and 124, of the signal present at input E111 of inverter 111, of the signal present at output S112 of inverter 112 (corresponding to output terminal NQ1 or to input terminal G2), of the signal present at input E121 of inverter 121, of direct output Q, and of inverted output NQ.

Figure 4:
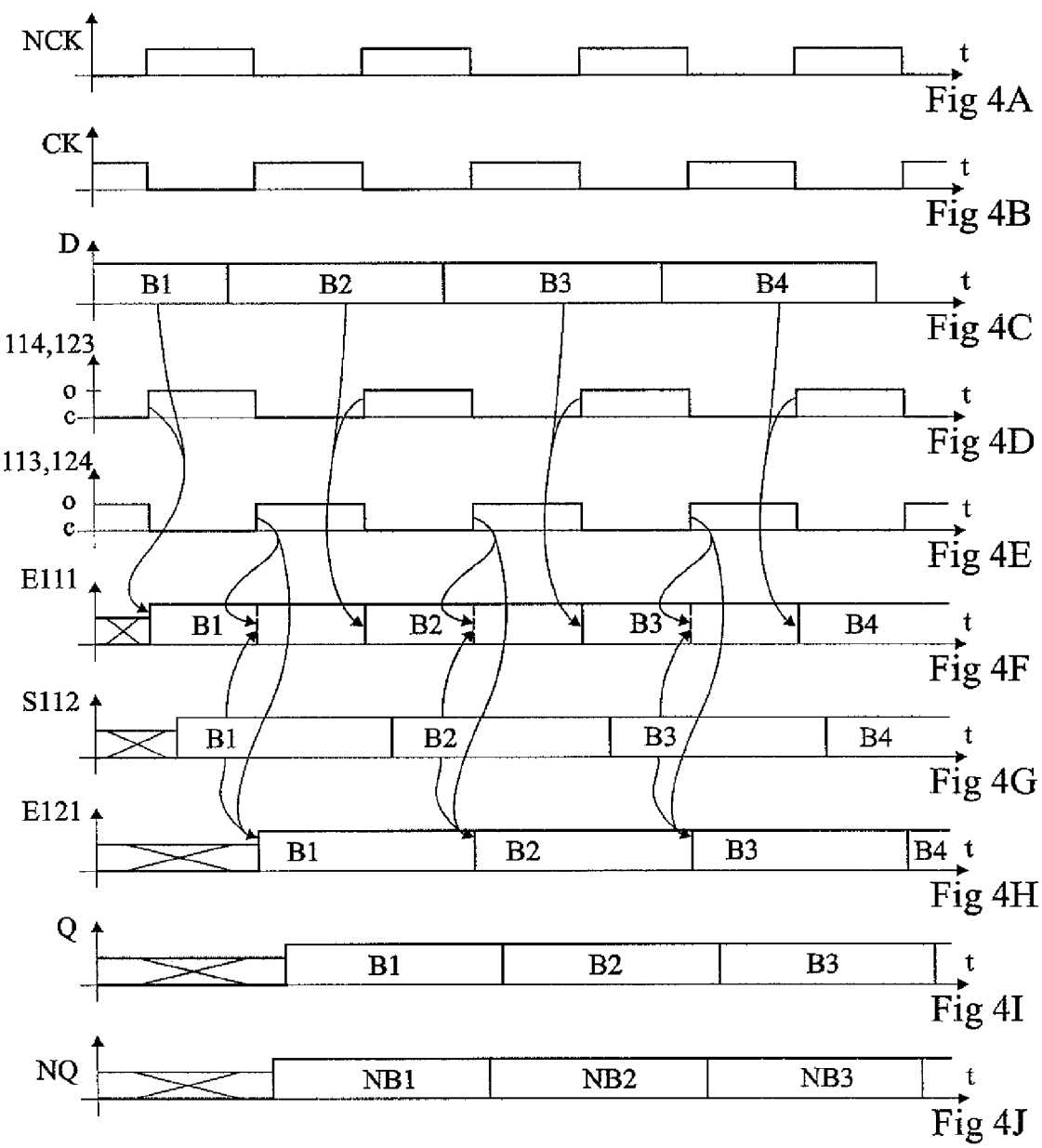
FIGS. 4A, 4B, 4C, 4D, 4E, 4F, 4G, 4H, 4I, and 4J illustrate, in timing diagrams, the operation of the flip-flop of FIG. 3.

These drawings illustrate the processing by flip-flop 1 of bits B1, B2, B3, and B4 of the data signal presented at the D input. For simplification, it is assumed that the data bits are each present during a full period of the clock signal. These drawings illustrate that a data bit is provided by the flip-flop with a delay period with respect to its input. During a first half-period, the datum present at the input is stored by first bistable circuit 11 while, in a second half-period, it is transferred to second bistable circuit 12 where it is stored. In FIGS. 4G, 4I, and 4J, the time shifts linked to the propagation times in the inverters have been exaggerated.

Figure 5:
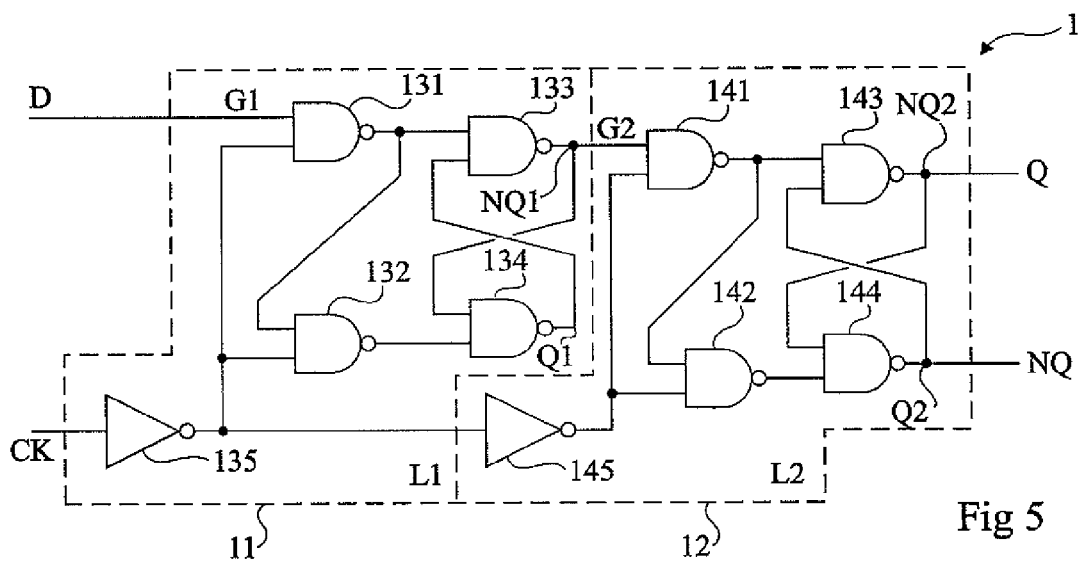
FIG. 5 shows the electric diagram of another example of a master-slave flip-flop.

FIG. 5 shows the electric diagram of a second example of a master-slave flip-flop 1 in which bistable circuits 11 and 12 are made in the form of logic NAND gates. Each bistable circuit comprises four gates 131, 132, 133, and 134, respectively 141, 142, 143, and 144, and an inverter 135, respectively 145. An input of a first gate 131, 141 defines data input G1, G2 of the bistable circuit. The output of this gate is connected to a first input of gate 132 or 142. The second respective inputs of gates 131 and 132, respectively 141 and 142, are connected to the output of inverter 135, respectively 145, to receive the inverse of clock signal CK. The respective outputs of gates 131 and 132, respectively 141 and 142, are connected to a first input of gate 133, respectively 143, having its second input connected to the output of gate 134, respectively 144. The output of gate 133, 143 is connected to the other input of gate 134, 144. The outputs of gates 133 and 134, respectively 143 and 144, define direct outputs Q1 and Q2, respectively inverted outputs NQ1 and NQ2, of the bistable circuits. The operation of the flip-flop of FIG. 5 can be deduced from its structure.

To form master-slave flip-lops on a falling edge, the clock signals just have to be inverted.

Figure 6:
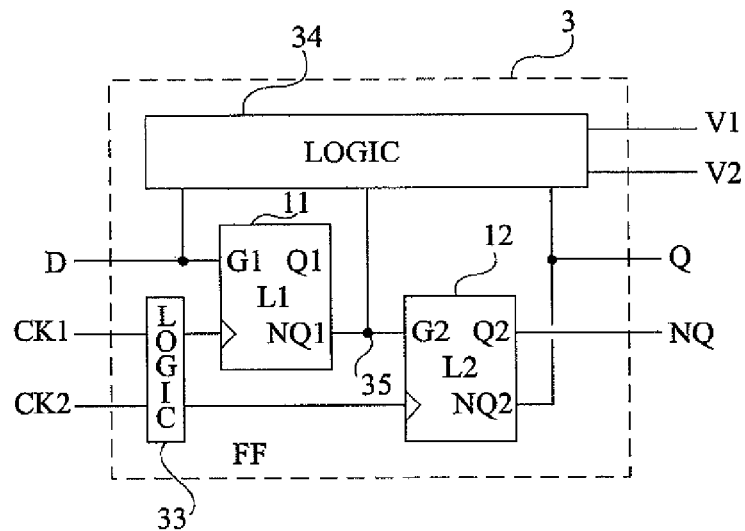
FIG. 6 is a block diagram of an embodiment of a master-slave flip-flop capable of detecting a possible disturbance.

FIG. 6 is a block diagram of an embodiment of a master-slave flip-flop 3 with a disturbance detection. It shows the two bistable circuits 11 and 12 which are, except for their triggering terminals, wired as in a usual master-slave flip-flop.

The triggering terminals of circuits 11 and 12 receive distinct signals, provided either directly from the outside, or set up by a logic block 33 (LOGIC) receiving two triggering signals applied on terminals CK1 and CK2 of flip-flop 3.

The detection of a possible disturbance of the datum is obtained by means of a logic circuit 34 (LOGIC) which interprets (combines) the respective states of the D input, of the Q output, and of transmission point 35 between the two bistable circuits. Point 35 thus corresponds to output value NQ1 of bistable circuit 11 and to input G2 of bistable circuit 12.

The implemented concept is to create a time window during which it is considered that the combinatory logic must be stable, and to create reference points within the actual master-slave flip-flop to verify the input, output, and intermediary values.

Figure 7:
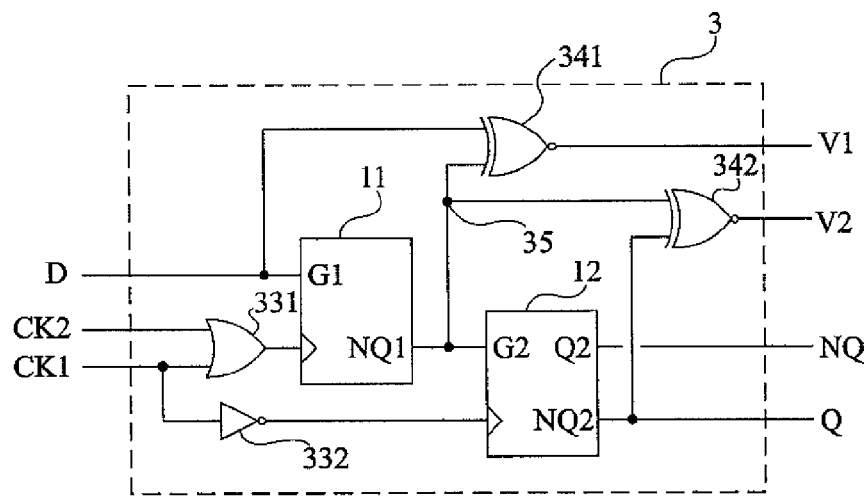
FIG. 7 is a more detailed block diagram of an embodiment of the master-slave flip-flop of FIG. 6.

FIG. 7 shows an embodiment of a master-slave flip-flop 3 in which logic circuits 33 and 34 have been detailed. The triggering signals applied on terminals CK1 and CK2 are combined by an OR-type gate 331 having its output connected to the triggering terminal of first bistable circuit 11. Terminal CK2 is further connected, after crossing of an inverter 332, to the triggering terminal of bistable circuit 12.

Interpretation circuit 34 comprises two Exclusive NOR-type gates 341 and 342 comparing the value (0 or 1) present at central point 35, respectively with the value of the D input and with the value of the Q output. The respective outputs of gates 341 and 342 provide two validation (or invalidation) signals V1 and V2 indicative of a respectively dynamic or static disturbance.

The function of gate 331 is to activate or not the detection mechanism within the flip-flop. If the flip-flop should always detect possible disturbances, this gate can be omitted. Signals CK1 and CK2 are then directly generated by a control circuit and inverter 332 can then also be omitted.

The presence of gate 331 enables selecting operating ranges (for example, periods when critical data in terms of security are manipulated) in which the absence of disturbances is verified and ranges where the detection is inactive. To deactivate the detection, the triggering signal applied on terminal CK2 is maintained in the low state. The triggering signal applied on terminal CK1 is then sent onto the clock input of circuit 11 while its inverse is sent onto the clock input of circuit 12. The flip-flop operates in this case in the same way as a usual flip-flop (FIG. 2). For an operation with detection, the triggering signals are generated to create four cyclic periods during which, successively:

circuits 11 and 12 are both latched;
circuit 11 is latched while circuit 12 lets through the datum (present at intermediary point 35);
circuits 11 and 12 are both latched; and
circuit 11 lets through the datum while circuit 12 is latched.

This amounts to adding to the two on/latched and latched/on states of a usual master-slave flip-flop a state in which both bistable circuits are latched. The transitions between the on/latched and latched/on states are thus lengthened by the addition of latched/latched states, while in usual master-slave devices, the transitions should be fast for the flip-flop to operate properly.

FIGS. 8A, 8B, 8C, 8D, and 8E are timing diagrams illustrating the operation of the master-slave flip-flop of FIGS. 6 and 7. These drawings show examples of the shape, respectively, of the triggering signals applied on terminals CK1 and CK2, of output signal S331 of gate 331 (signal triggering circuit 11), of output S332 of inverter 332 (signal triggering circuit 12), and of the data transfer windows within the master-slave flip-flop. For simplification, terminals CK1, CK2, S331, S332, and the corresponding triggering signals will be confounded in the following discussion.

In a first period P1 (signal CK1 in the low state and signal CK2 in the high state), signals S331 and S332 are both in the high state. At the rising edge (time t0) of signal S331 (rising edge of signal CK2) which starts this period P1, bistable circuit 11 stores the value present on its data input (and thus the datum at the flip-flop input) and latches on this value. Bistable circuit 12 remains latched on the former value.

A second period P2 starts at the rising edge (time t1) of signal CK1 from which bistable circuit 12 becomes conductive and enables the propagation of the datum stored in first bistable circuit 11 to the Q output of the master-slave flip-flop.

At the falling edge (time t2) of signal CK1, bistable circuit 12 latches the datum (period P3).

Finally, at the falling edge (time t3) of signal CK2, bistable circuit 11 turns back on to acquire a new value of data signal D (period P4).

It can be seen that, in periods P1 and P3, bistable circuits 11 and 12 are both latched. However, in period P1, they are latched on different values while in period P3, they are latched on the same value. Accordingly, in a correct operation, the value present at point 35 corresponds to the input datum in period P1 and to the output datum in period P3.

Periods P1 and P3 are used to detect the occurrence of a disturbance. In the absence of a disturbance, the state of point 35 should be identical to that of the D input during period P1, while it should be identical to that of the Q output during period P3.

The verification may be performed at any time in these periods by examining the states presented by signals V1 and V2.

A particularly simple solution is to use signals CK1 and CK2 (or S331 and S332) to trigger the detection.

A first verification is then performed by comparing, at time t1 (rising edge of signal CK1 or falling edge of signal S332) corresponding to the end of period P1, the states of the D input and of output NQ1. If they are identical, this means that the datum has not been modified during the acquisition. Indeed, if a disturbance occurs, it is limited in time and does not translate as a modification in the respective states stored by the two bistable circuits. Desynchronizing their operation enables authorizing such a dynamic disturbance detection.

A second verification is performed by comparing, at time t3 (falling edge of signal CK2 or of signal S331) corresponding to the end of period P3, the states of the Q output and of point 35. This amounts to detecting a static disturbance.

Preferably, periods P2 and P4 are selected to be as short as possible. The duration of period P2 should, however, remain longer than the minimum duration of the high level on the data input of bistable circuit 12. The duration of period P4 should remain longer than the minimum duration of the low level on the data input of bistable circuit 11. Such minimum durations depend on the characteristics of the bistable circuits and are known for a given circuit, which enables appropriately generating signals CK1 and CK2.

FIG. 9 shows an embodiment of a circuit 4 for comparing and interpreting the results detected by the flip-flops. In the example, it is assumed that several flip-flops of a same integrated circuit provide signals V1 and V2 which are combined by OR gates 41 and 42 before being sampled by flip-flops 43 and 44 to be processed by a circuit 45 (for example, a processor). In the case where a single master-slave flip-flop is monitored, combinations 41 and 42 are not necessary. Flip-flop 43 is triggered by signal CK1 while flip-flop 44 is triggered by the inverse of signal CK2. Processing circuit 45 interprets the detections performed by signals V1 and V2 and takes the adapted countermeasures.

FIG. 10 shows an example of an electronic system comprising at least two circuits 5 (IC1) and 6 (IC2). At least one of these circuits (in the example, circuit 5) is equipped with a mechanism for detecting incidental or intentional disturbances on master-slave flip-flops 3 that it comprises between logic blocks. All or part of the flip-flops intermediary between logic functions are equipped with the above-described functionalities. Signals V1 and V2 of the flip-flops are exploited by a decision circuit 4 (DECID) and triggering signals CK1 and CK2 are, for example, generated by a control circuit 7 (CTRL) based on a clock signal CLOCK of circuit 5.

It is now possible to detect the occurrence of a disturbance in a logic circuit comprising synchronization flip-flops of master-slave type.

The structure provided for the master-slave flip-flop further enables to activate or to deactivate the detection.

Moreover, the presence of several detection flip-flops in a logic path enables to detect the occurrence of a disturbance in the entire logic path.

Further, the fact of using output NQ1 instead of output Q1 for the comparison by gates 341 and 342 improves the detection in case of an attack modifying in the same way the respective states of the two circuits 11 and 12.

Specific embodiments of the present invention have been described. Various alterations and modifications are within the abilities of those skilled in the art. In particular, although the present invention has been more specifically described in relation with master-slave flip-flops having no reset or set input, it easily transposes to such flip-flops. Further, although two practical examples have been described in detail, the present invention is compatible with any flip-flop of this type, provided for the intermediary point between the two bistable circuits to be exploitable.

Moreover, the generation of control signals CK1 and CK2 has not been detailed, this generation being within the abilities of those skilled in the art based on the functional indications given hereinabove and by using circuit which are themselves current.

Finally, other logic circuits may be provided, provided to respect the described functionalities. In particular, the different considered states may be inverted by adapting the triggering signals. Further, the logic comparisons of block 34 may if desired be external to the flip-flop, the intermediary point of which will have been made accessible.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for detecting a disturbance of a state of a master-slave flip-flop of synchronous type, the master-slave flip-flop comprising two bistable circuits in series, the method comprising:
   triggering, when two terminals of application of triggering signals receive the triggering signals, the two bistable circuits by two first signals different from each other, wherein each bistable circuit of the two bistable circuits comprises a triggering terminal;
   generating, by a first logic circuit, two second signals providing an indication as to a presence of a possible disturbance of the state of the master-slave flip-flop by:
      generating a first of the two second signals by comparing, at a first time, a first level of an intermediary junction point between the two bistable circuits to a second level present at the input of the master-slave flip-flop, the first of the two second signals having a value indicating a disturbance of the state of the master-slave flip-flop when the first level differs from the second level at the first time; and
      generating a second of the two second signals by comparing, at a second time, different than the first time, the first level of the intermediary junction point to a third level present at an output of the master-slave flip-flop, the second of the two second signals having a value indicating a disturbance of the state of the master-slave flip-flop when the first level differs from the third level at the second time; and
   outputting, by an output terminal, the second signals to a detector circuit arranged to determine whether there is a disturbance of the state of the master-slave flip-flop when the first of the two second signals generated at the first time or the second of the two second signals generated at the second time has a value indicating a disturbance of the state of the master-slave flip-flop.

2. The method of claim 1, wherein the second signals are generated based on sampling timed by edges of the first signals.

3. The method of claim 1, further comprising:
   following detection of a constant level of one of the first signals, refraining from performing the comparing and outputting until detecting that the one of the first signals is no longer at a constant level.

4. A method for detecting a disturbance of a state of a master-slave flip-flop of synchronous type, the master-slave flip-flop comprising two bistable circuits in series, the method comprising:
   triggering the two bistable circuits by two first signals different from each other;
   comparing a first level of an intermediary junction point between the two bistable circuits both to a second level present at the input of the master-slave flip-flop and to a third level present at an output of the master-slave flip-flop and, based on the comparing, generating two second signals providing an indication as to a presence of a possible disturbance,
   wherein the first signals are generated so that the bistable circuits are controlled cyclically in four successive periods in which:
   both circuits are latched;
   only a first circuit is latched;
   both circuits are latched; and
   only a second circuit is latched.

5. The method of claim 4, wherein the periods where both circuits are latched provide, on the second signals, states indicative of a possible disturbance.

6. A master-slave synchronous flip-flop comprising:
   two bistable circuits in series, each bistable circuit comprising a triggering terminal;
   two terminals of application of triggering signals different from each other;
   a first logic circuit to detect a disturbance of a state of the master-slave synchronous flip-flop by comparing a first level of a flip-flop input, a second level at a node between the two bistable circuits, and a third level at a flip-flop output, the first logic circuit producing an output signal based at least in part on the comparing;
   an output terminal to output the output signal produced by the first logic circuit to a detector circuit arranged to determine whether there is a disturbance of the state; and
   a second logic circuit having inputs coupled to the two terminals of application of the triggering signals and outputs coupled to respective triggering terminals of the two bistable circuits.

7. The flip-flop of claim 6, wherein the first logic circuit comprises two comparators, a first comparator being configured to compare the first level of the flip-flop input to the second level of the node between the two bistable circuits and the second comparator being configured to compare the second level of to the third level of the flip-flop output.

8. An electronic circuit comprising:
at least one logic combination block having at least one input and at least one output; and
at least one set of master-slave synchronous flip-flops,
wherein at least one of the flip-flops in the set of master slave flip-flops is in accordance with claim 6, and the two terminals of application of triggering signals are coupled to the at least one output of the at least one combination block.

9. The electronic circuit of claim 8, wherein not all flip-flops are controlled at the same time in comparison mode.

10. The master-slave synchronous flip-flop of claim 6, further comprising a detector circuit.

11. The master-slave synchronous flip-flop of claim 6, wherein the second logic circuit comprises:
an OR-type gate having two inputs, each input connected to one of the two terminals of application of the triggering signals, and having an output connected to a first triggering terminal of a first bistable circuit of the two bistable circuits; and
an inverter between one of the two terminals of application of the two triggering signals and a second triggering terminal of a second bistable circuit of the two bistable circuits.

12. A master-slave synchronous flip-flop comprising:
two bistable circuits in series;
two terminals of application of triggering signals different from each other;
a first logic circuit to detect a disturbance of a state of the master-slave synchronous flip-flop by comparing a first level of a flip-flop input, a second level at a node between the two bistable circuits, and a third level at a flip-flop output, the first logic circuit producing an output signal based at least in part on the comparing;
wherein each bistable circuit comprises a triggering terminal, and
wherein the master-slave synchronous flip-flop further comprises a second logic circuit interposed between the two terminals of application of the triggering signals and respective triggering terminals of the bistable circuits, wherein the second logic circuit comprises:
an OR-type gate having two inputs, each input connected to one of the two terminals of application of the triggering signals, and having an output connected to a first triggering terminal of a first bistable circuit of the two bistable circuits; and
an inverter between one of the two terminals of application of the two triggering signals and a second triggering terminal of a second bistable circuit of the two bistable circuits.

13. An apparatus comprising:
a plurality of storage circuits, each of the storage circuits comprising:
an input terminal, a first output terminal, and at least one second output terminal;
a first flip-flop comprising a first input and a first output, the first input being coupled to the input terminal;
a second flip-flop comprising a second input and a second output, the second input being coupled to the first output and the second output being coupled to the first output terminal; and
at least one detector to evaluate a first voltage level present on the input terminal, a second voltage level present at a node between the first output and the second input, and/or a third voltage level present on the output terminal and to produce, based on the evaluation, at the at least one second output terminal at least one signal indicating whether the at least one detector detects a disturbance; and
at least one aggregation circuit, having a plurality of third inputs and a third output, each third input being coupled to a respective output terminal of a detector of a storage circuit of the plurality of storage circuits, the at least one aggregation circuit to produce at least one aggregated output signal indicating whether the at least one detector of a storage circuit of the plurality of storage circuits detects a disturbance.

14. The apparatus of claim 13, wherein:
for each of the plurality of storage circuits, the at least one detector comprises a first detector and a second detector,
the first detector is configured to compare the first voltage level to the second voltage level and output at the at least one second output terminal a first signal indicating a result of the comparison, and
the second detector is configured to compare the second voltage level to the third voltage level and output at the at least one second output terminal a second signal indicating a result of the comparison.

15. The apparatus of claim 14, wherein the first detector is configured to compare the first voltage level to the second voltage level to determine whether the first voltage level and the second voltage level are equivalent and, if the first voltage level and the second voltage level are equivalent, output the first signal indicating the first detector has not detected a disturbance, and
wherein the second detector is configured to compare the second voltage level to the third voltage level to determine whether the second voltage level and the third voltage level are equivalent and, if the second voltage level and the third voltage level are equivalent, output the second signal indicating the second detector has not detected a disturbance.

16. The apparatus of claim 15, wherein the first detector and second detector are configured to perform the respective comparisons at different times.

17. The apparatus of claim 14, further comprising:
a decision circuit to determine whether there is a disturbance based on the at least one aggregated output signal.

18. The apparatus of claim 13, further comprising:
a decision circuit to determine whether there is a disturbance based on the at least one aggregated output signal.

19. The apparatus of claim 13, wherein:
each of the plurality of storage circuits further comprises a first clock input of the first flip-flop and a second clock input of the second flip-flop; and
the apparatus further comprises a logic circuit coupled to a clock input terminal and having a first clock output and a second clock output, the first clock output being coupled to the first clock input of the first flip-flop of each of the plurality of storage circuits and the second clock output being coupled to the second clock input of the second flip-flop of each of the plurality of storage circuits, the logic circuit producing on the first clock output a first clock signal and producing on the second clock output a second clock signal.

20. The apparatus of claim 13, wherein:
each of the plurality of storage circuits further comprises:
a first clock input terminal and a second clock input terminal,
a logic circuit coupled to the first clock input terminal and the second clock input terminal and having a first clock output and a second clock output, the first clock output being coupled to a first clock input of the first flip-flop and the second clock output being coupled to a second clock input of the second flip-flop, the logic circuit producing on the first clock output a first clock signal and producing on the second clock output a second clock signal, the logic circuit comprising an OR gate and an inverter, wherein:
  the OR gate comprises inputs coupled to the first clock input terminal and the second clock input terminal and an output coupled to the first clock input of the first flip-flop, and
  the inverter comprises an input coupled to the first clock input terminal and an output coupled to the second clock input of the second flip-flop.

21. A method of operating a storage circuit comprising a first flip-flop and a second flip-flop connected in series, the method comprising:
  latching values present on an input terminal of a storage circuit into the first flip-flop and the second flip-flop in response to a triggering signal; and
  producing at least one output from the storage circuit indicative of whether a disturbance of a latched value of the latched values or the triggering signal has been detected at least in part by comparing a first voltage level present on the input terminal, a second voltage level present at a node between the first flip-flop and the second flip-flop connected in series, and a third voltage level present at an output terminal of the storage circuit, the at least one output indicating the disturbance of the latched value or the triggering signal when:
    the first voltage level differs from the second voltage level at a first time that is a hold time after latching the value of the values into the first flip-flop; or
    the second voltage level differs from the third voltage level at a second time that is a hold time after latching the value of the values into the second flip-flop;
  wherein:
    latching the values comprises latching the values based at least in part on a first clock signal and a second clock signal received by the storage circuit, and
    the method further comprises, upon detecting that the first clock signal is being held at a constant level, disabling the comparing.

22. The method of claim 21, wherein:
  latching values present on an input terminal of the storage circuit into a first flip-flop and a second flip-flop comprises clocking the first flip-flop and the second flip-flop with triggering signals that create four cyclic periods.

23. The method of claim 22, wherein producing the at least one output comprises:
  producing a first output indicating whether the first voltage level and the second voltage level are equivalent, and
  producing a second output indicating whether the second voltage level and the third voltage level are equivalent.

24. The method of claim 23, further comprising:
  determining whether there is a disturbance by evaluating the first output and/or the second output.

25. The method of claim 21, further comprising:
  taking at least one action in response to a disturbance based on evaluating the at least one output.

26. The method of claim 21, further comprising:
  when a disturbance is detected, taking at least one countermeasure in response to the disturbance.

* * * * *

UNITED STATES PATENT AND TRADEMARK OFFICE
CERTIFICATE OF CORRECTION

| | |
|---|---|
| PATENT NO. | : 8,466,727 B2 |
| APPLICATION NO. | : 12/510704 |
| DATED | : June 18, 2013 |
| INVENTOR(S) | : Frédéric Bancel et al. |

It is certified that error appears in the above-identified patent and that said Letters Patent is hereby corrected as shown below:

In the Specifications:

Col. 4, line 54 should read:
To form master-slave flip-flops on a falling edge, the clock Signed and Sealed this
Sixth Day of August, 2013

Teresa Stanek Rea
*Acting Director of the United States Patent and Trademark Office*